United States Patent [19]

Nugent et al.

[11] Patent Number: 4,843,349
[45] Date of Patent: Jun. 27, 1989

[54] UHF CRYSTAL OSCILLATOR

[75] Inventors: John L. Nugent, Essex; Norman G. Matthews, Sparks, both of Md.

[73] Assignee: Westinghouse Electric Corp., Pittsburgh, Pa.

[21] Appl. No.: 186,867

[22] Filed: Apr. 27, 1988

[51] Int. Cl.⁴ .............................................. H03B 5/30
[52] U.S. Cl. ................................ 331/116 R; 331/158
[58] Field of Search ............ 331/116 R, 116 FE, 158, 331/175; 368/159

[56] References Cited

U.S. PATENT DOCUMENTS

| | | | |
|---|---|---|---|
| 3,875,533 | 4/1975 | Irwin et al. | 331/116 R |
| 4,001,724 | 1/1977 | Keller | 331/116 R |
| 4,570,132 | 2/1986 | Driscoll | 331/56 |
| 4,646,034 | 2/1987 | Chauvin et al. | 331/116 R |

FOREIGN PATENT DOCUMENTS 2069788A 8/1981 United Kingdom .

OTHER PUBLICATIONS

*Direct Frequency Crystal Oscillators,* Lewis B. Dart and Jacques Chauvin, Proc. 35th Annual Frequency Control Symposium, USAERADCOM, Fort Monmouth, N.J. (May, 1981).

Primary Examiner—Eugene R. Laroche
Assistant Examiner—Robert J. Pascal
Attorney, Agent, or Firm—J. C. Spadacene

[57] ABSTRACT

A crystal-controlled oscillator operable at a direct UHF frequency includes an amplifier having a feedback circuit formed from an SC-cut crystal and an impedance network. The impedance network provides an impedance load for the cyrstal, and the values of the individual components forming the impedance network are selected to provide an overall inductive load for the SC-cut crystal. Inductively loading the cyrstal permits the crystal to oscillate at the C mode or UHF frequency mode, and prevents unwanted crystal oscillation at the B mode or VHF mode.

11 Claims, 2 Drawing Sheets

UHF CRYSTAL OSCILLATOR

BACKGROUND OF THE INVENTION

1. Field of the Invention

This invention relates generally to an oscillator, and more particularly, to a crystal-controlled oscillator operable at a direct UHF frequency.

2. Background Information

The difficulties associated with directly generating pure UHF signals by means of a crystal-controlled oscillator are well known and stem from the design limitations of presently available crystals. In the past, commercially available crystals had a maximum oscillation frequency of approximately 150 MHz, which falls well below the UHF range. Recently, new techniques have been developed by crystal manufacturers to design crystals which are directly operable in the UHF range. These crystals are SC-cut and are capable of operating in a third overtone mode having a range of between 250 and 400 megacycles. Although SC-cut crystals are capable of UHF oscillation, these newly developed crystals have been successfully used only in passive mode filter circuitry. When a UHF-range crystal was operated in a UHF oscillator circuit, the crystal automatically oscillated at a lower, VHF frequency.

Since known SC-cut crystal-controlled oscillators of various designs are incapable of generating a direct UHF signal, other techniques had to be developed for generating monochromatically pure UHF signals. One known technique includes the steps of generating VHF signals utilizing a VHF crystal oscillator typically having a range of between 80 to 100 MHz, and thereafter multiplying the VHF signal to UHF by means of a step recovery frequency multiplier. This technique, however, has a basic limitation in that passing the VHF signal through conventional frequency multiplication circuitry to transform the signal to UHF results in a degradation of the signal phase noise response by the term 20 log n, where n is the frequency multiplication factor. Since many electronic systems (i.e.—radar) are directly affected by oscillator phase noise response, an increase in phase noise degradation results in a corresponding degradation of the electronic system performance.

Therefore, there is a need for a crystal-controlled oscillator of improved design which eliminates the phase noise degradation problems which exist with present crystal-controlled oscillators. The improved oscillator must be capable of generating a direct UHF frequency signal to eliminate the need for presently used frequency multiplication circuitry.

SUMMARY OF THE INVENTION

In accordance with the present invention, there is provided a crystal controlled oscillator operable at a direct UHF frequency which includes an amplifier having first, second and third terminals, the third terminal being an output terminal. A tuning circuit is connected between the amplifier first terminal and ground potential, the tuning circuit receiving a preselected value of voltage for biasing the amplifier. Piezoelectric crystal means is connected to the amplifier first terminal, the piezoelectric crystal means being capable of resonating at a first UHF frequency mode and a second, VHF frequency mode. An impedance network is connected between the piezoelectric crystal means second terminal and the amplifier second terminal to provide an impedance load for the crystal means. The impedance network/crystal means combination forms a feedback circuit between the amplifier first and second terminals operable to establish a preselected frequency of oscillation for the crystal means. The impedance load has an overall inductive characteristic to provide that the preselected frequency of oscillation of the crystal means takes place at the first, UHF frequency mode.

Further, in accordance with the present invention, there is provided a crystal-controlled oscillator operable at a direct UHF frequency comprising an amplifier having first, second and third terminals. A tuning circuit is connected to the amplifier third terminal, the tuning circuit receiving a preselected value of voltage for biasing the amplifier. A piezoelectric crystal means has a first terminal connected with the amplifier first terminal and a second, output terminal. The piezoelectric crystal means is capable of resonating at either a first, UHF frequency mode or a second, VHF frequency mode. An impedance network is connected between the amplifier first and third terminals, and is also connected in parallel electrical relation with the piezoelectric crystal means to provide an impedance load for the crystal means. The impedance network and the crystal means form a feedback circuit between the amplifier first and third terminals operable to establish a preselected frequency of oscillation for the crystal means. The impedance load has an overall inductive characteristic to provide that the preselected frequency of oscillation of the crystal means is at the first, UHF frequency mode.

Still further in accordance with the present invention, there is provided a method for making a crystal controlled oscillator operable at a direct UHF frequency which includes the steps of connecting a tuning circuit between a first terminal of an amplifier and ground potential, the tuning circuit receiving a preselected value of voltage for biasing the amplifier. A piezoelectric crystal means is connected to the first terminal of the amplifier, the piezoelectric crystal means being capable of resonating at either a first UHF frequency mode or a second, VHF frequency mode. An impedance network is interposed between the piezoelectric crystal means and the amplifier second terminal to provide an impedance load for the crystal means. The impedance network and the crystal means form a feedback circuit operable to establish a preselected frequency of oscillation for the crystal means. The individual components of the impedance network are selected to provide that the impedance load presented to the crystal by the impedance network has an overall inductive characteristic so that the preselected frequency of oscillation takes place at the first, UHF frequency mode.

DESCRIPTION OF THE PREFERRED EMBODIMENTS

Figure 1:
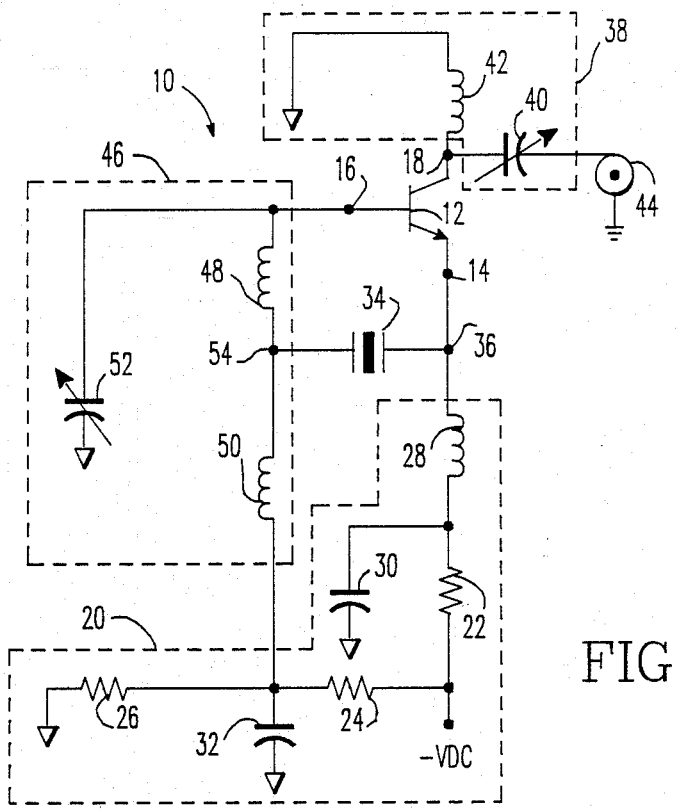
FIG. 1 is a schematic diagram of one embodiment of the UHF oscillator of the present invention.

Referring to the drawings, and particularly to FIG. 1, there is illustrated an oscillator generally designated by the numeral 10 capable of operating at a direct UHF frequency to produce a pure UHF signal. Oscillator 10 has a circuit design which eliminates the need for the frequency multiplication circuitry presently utilized to transform generated VHF signals to UHF.

As seen in FIG. 1, oscillator 10 includes a transistor-type amplifier 12. Amplifier 12 includes first, second and third terminals 14, 16 and 18 which correspond to conventional transistor emitter, base and collector terminals, respectively. It should be pointed out that the use of a transistor to form the amplifier section of an oscillator is itself well known in the art.

A tuning circuit generally designated by the numeral 20 is connected with amplifier 12 first or emitter terminal 14. Tuning circuit 20 includes resistors 22, 24 and 26 which act as biasing resistors for the base-emitter junction of the transistor-type amplifier 12 between first terminal 14 and second terminal 16. Tuning circuit 20 further includes an RF choke 28, and a pair of bypass capacitors 30 and 32. The use of a tuning circuit such as tuning circuit 20 in conjunction with the transistor-type amplifier of an oscillator is also known in the art, and is therefore described herein only as it pertains to the present invention.

A crystal 34 has a first terminal 36 electrically connected to amplifier 12 first terminal 14. Crystal 34 is an SC-cut crystal. As known in the art, all SC-cut crystals are capable of resonating at two distinct modes: a first UHF frequency mode and a second, VHF frequency mode. The first, UHF frequency mode is a B mode or fast shear mode; and the second, VHF frequency mode is a C mode or slow shear mode. As will be described later in greater detail, the unique design of oscillator 10 allows crystal 34 to resonate or oscillate at the first UHF frequency mode, and simultaneously prevents the crystal from oscillating at the unwanted VHF frequency mode.

A load adjustment circuit generally designated by the numeral 38 is connected to amplifier 12 third terminal 18. Load adjustment circuit 38 includes a variable capacitor 40 and an inductor 42. Capacitor 40 performs an impedance transformation to match the overall impedance of oscillator 10 with the impedance of an external load (not shown) connected to oscillator 10 output terminal 44. It should be pointed out that load adjustment circuit 38 is also known in the art, and is described herein only as it pertains to the present invention.

As seen in FIG. 1, oscillator 10 further includes an impedance network generally designated by the numeral 46. Impedance network 46 is formed from a pair of inductors 48, 50 and a variable capacitor 52. The inductors 48, 50 are serially connected with each other, and they are connected in parallel relationship with capacitor 52. The second terminal 54 of crystal 34 is connected between the pair of inductors 48, 50, and the crystal 34/impedance network 46 combination forms a feedback circuit between amplifier 12 first and second terminals 14, 16. The impedance network 46 sets the overall value of the impedance seen by crystal 34, which is dependent upon the individual component values of inductors 48, 50 and capacitor 52. Stated in another manner, impedance network 46 provides an impedance load for crystal 34 having an overall value set by the inductive and capacitive values of elements 48, 50, 52. In addition, the feedback circuit formed by the impedance network 46/crystal 34 combination establishes a preselected frequency of oscillation mode for crystal 34, which may either be the UHF or VHF mode.

The values of inductors 48, 50 and capacitor 52 are selected in accordance with the present invention to provide that the impedance load seen by crystal 34 has an overall inductive characteristic, since it has unobviously been found that loading an SC-cut crystal with an overall inductive load will cause the crystal to resonate at a desired UHF frequency mode and prevent the crystal from oscillating at an unwanted, VHF frequency mode. It should be understood that the exact component values of inductors 48, 50 and capacitors 52 may be varied depending upon the desired UHF frequency of oscillation. For example, if it is desired to provide an oscillator 10 which utilizes an SC-cut crystal and operates at a UHF frequency of 320 MHz, then the values of L1 and L2 should be set at 0.12 $\mu$h and 0.033 $\mu$h. Capacitor 52 may be a variable capacitor as illustrated in FIG. 1, and should have a component value within a range of between 1–30 pf.

As described, providing an impedance network 46 with an overall inductive characteristic as an impedance load for SC-cut crystal 34 will cause crystal 34 to oscillate in the UHF frequency range. The preselected UHF frequency of oscillation is determined by the individual component values of inductors 48, 50 and capacitor 52. By loading crystal 34 with an overall inductive load, crystal 34 will be prevented from oscillating at the lower VHF frequency, thus eliminating the need for frequency multiplication circuitry.

Figure 2:
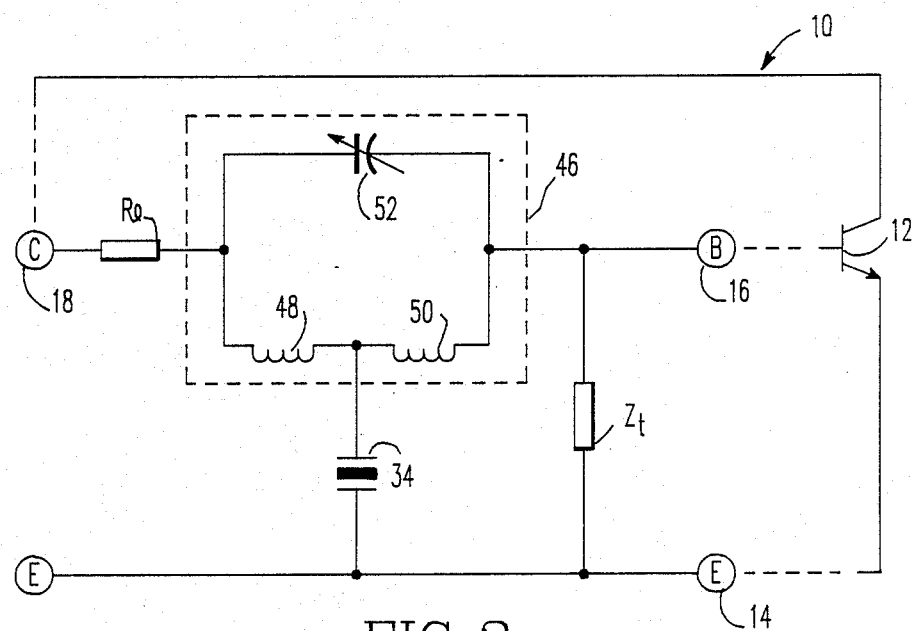
FIG. 2 is a bridged-tee representation of the UHF oscillator of FIG. 1.

Referring to FIG. 2, there is illustrated a bridged-tee circuit representation of the oscillator 10 illustrated in FIG. 1. The bridged-tee representation is also designated by the numeral 10. As seen in FIG. 2, the inductors 48, 50 of impedance network 46 are serially connected with each other and are in parallel electrical relationship with capacitor 52.

Crystal 34, which is connected between first amplifier 12 terminal 14 and impedance network 46, forms a part of the feedback circuit between the base and emitter of transistor 12 to stabilize the transistor performance. Impedance $Z_t$ represents the current generator of transistor 12, and $R_1$ represents the load resistance driven by the amplifier collector or third terminal 18. Analysis of the bridged-tee circuit for a desired UHF frequency mode of oscillation will determine the values of inductors 48, 50 and capacitor 52. The values of inductors 48, 50 and capacitor 52 must be selected to provide that motional capacitance of crystal 34 is not swamped by the capacitance of impedance network 46, since an SC-cut crystal will operate at a direct UHF frequency, only if the crystal drives an apparent inductive load $(+j)$ rather than a capacitive load $(-j)$.

Figure 3:
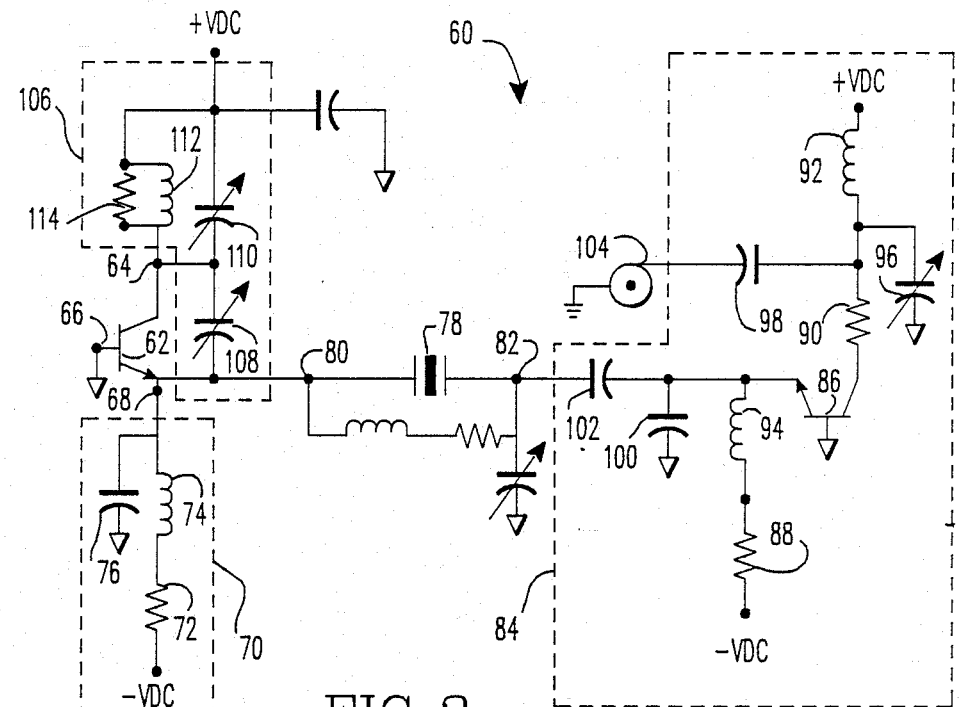
FIG. 3 is a schematic diagram of an alternate embodiment of the UHF oscillator of the present invention.

Now referring to FIG. 3, there is illustrated an alternate oscillator 60 which is also capable of operating at a direct UHF frequency to produce a pure UHF signal. As with oscillator 10 previously described, oscillation 60 eliminates the need for the frequency multiplication circuitry presently utilized to transform generated VHF signals to UHF. As seen in FIG. 3, the oscillator 60 includes a transistor-type amplifier 62 having a first or collector terminal 64, a second or base terminal 66 and a third or emitter terminal 68. A tuning circuit generally designated by the numeral 70 is connected to amplifier third or emitter terminal 68 to provide proper biasing for the emitter-base junction of transistor-type amplifier 62. As with the tuning circuit 20 of FIG. 1, tuning circuit 70 includes a resistor 72, an inductor 74 and a bypass capacitor 76. Tuning circuit 70 is itself known in the art and is described herein only as it pertains to the present invention.

An SC-cut crystal 78 having the properties previously described has a first terminal 80 electrically connected with amplifier 62, third terminal 68 and a second or output terminal 82 connected with a buffer circuit or load adjustment circuit generally designated by the numeral 84. As known in the art, buffer circuit 84 is utilized to reduce the external loading seen by crystal 78, and also to provide a preselected level of amplification for the signal present at crystal second terminal 82. Thus, transistor 86, resistors 88 and 90, inductors 92 and 94, and capacitors 96–102 are arranged as illustrated in FIG. 3 to provide both proper impedance matching between crystal 78 and an external load (not shown) connected to oscillator 60 output terminal 104 and to amplify the produced UHF signal. It should be pointed out that the use and configuration of buffer circuits such as buffer circuit 84 are known in the art.

As seen in FIG. 3, oscillator 60 also includes an impedance network generally designated by the numeral 106 connected between amplifier 62, first and third terminals 64, 68. Impedance network 106 includes a pair of variable capacitors 108, 110, an inductor 112 and a shunt resistor 114. The pair of variable capacitors 108, 110 are serially connected with each other, and are connected in parallel relationship with the parallel combination of inductor 112 and resistor 114. As seen in FIG. 3, impedance network 106 is connected in parallel electrical relationship with crystal 78 to provide an impedance load for crystal 78.

As previously described when discussing impedance network 46 illustrated in FIGS. 1 and 2, impedance network 106 sets the overall value of the impedance seen by crystal 78, which is dependent upon the individual component values of capacitors 108, 110 and inductor 112. Stated in another manner, impedance network provides an impedance load for crystal 78 having an overall value set by the inductive and capacitive values of elements 108, 110, 112.

The combination of crystal 78 and impedance network 106 form a feedback circuit which establishes a preselected frequency of oscillation mode for crystal 78 which may either be the UHF or VHF mode. These component values are selected in accordance with the present invention to provide that the impedance load seen by crystal 78 has an overall inductive characteristic, since loading an SC-cut crystal with an overall inductive load will cause the crystal to resonate at a desired UHF frequency mode and prevent the crystal from oscillating at an unwanted VHF frequency mode.

It should be understood that the exact component values of capacitors 108, 110 and inductor 112 may be varied depending upon the desired UHF frequency of oscillation. For example, if it is desired to provide an oscillator 60 which utilizes an SC-cut crystal 78 and operates at a frequency of 320 MHz, the values of variable capacitors 108, 110 should fall within a range of between 1 and 30 pf and the value of inductor 112 should be set at 0.015 $\mu$h.

Figure 4:
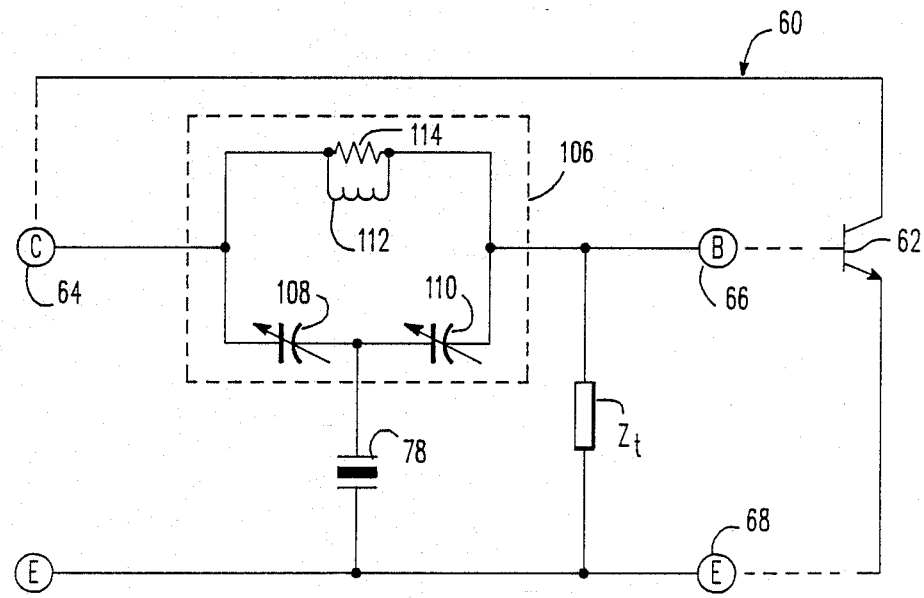
FIG. 4 is a bridged-tee representation of the UHF oscillator of FIG. 3.

Referring to FIG. 4, there is illustrated a bridged-tee network circuit representation of the crystal controlled oscillator 60 illustrated in FIG. 3. As seen in FIG. 4, the impedance network 106, which is formed from the pair of serially connected variable capacitors 108, 110 in parallel relationship with inductor 112 and resistor 114, provides an impedance load for crystal 78. The impedance network 106 and crystal 78 form a feedback circuit between the base terminal 66 and emitter terminal 68 of transistor-type amplifier 62 to stabilize the performance of transistor 62. The impedance $Z_t$ represents the current generator of transistor 62. Analysis of the bridged-tee circuit for a desired UHF frequency mode of oscillation will determine the values of capacitors 108, 110, inductor 112 and resistor 114. These inductive, capacitive and resistive component values must be selected to provide that the motional capacitance of crystal 78 is not swamped out by the capacitance of impedance network 106, since an SC-cut crystal will operate at a direct UHF frequency mode only if the crystal drives an apparent inductive load ($+j$) rather than a capacitive ($-j$) load.

As described herein, both the oscillator 10 illustrated in FIGS. 1 and 2 and the oscillator 60 illustrated in FIGS. 3 and 4 are operable at a direct UHF frequency to produce a pure UHF signal without requiring the use of frequency multiplication circuitry. Each oscillator employs an SC-cut crystal having both a B-mode (fast shear) and a C mode (slow shear) of operation. By properly selecting the individual component values forming the impedance network in each oscillator to inductively load the SC-cut crystal, direct UHF oscillation is achieved. In addition, inductively loading each crystal prevents the crystal from oscillating in the unwanted B mode or VHF frequency mode.

Although the present invention has been described in terms of what are at present believed to be its preferred embodiments, it will be apparent to those skilled in the art that various changes may be made without departing from the scope of the invention. It is therefore intended that the appended claims cover such changes.

We claim:

1. A crystal controlled oscillator operable at a direct UHF frequency comprising:
    an amplifier having first, second and third terminals, said third terminal being an output terminal;
    a tuning circuit connected between said amplifier first and second terminals, said tuning circuit receiving a preselected value of voltage for biasing said amplifier;
    piezoelectric crystal means having a first terminal connected to said amplifier first terminal and a second terminal;
    said piezoelectric crystal means being capable of operating at a first UHF frequency mode and a second, VHF frequency mode;
    an impedance network connected between said piezoelectric crystal means second terminal and said amplifier second terminal to provide an impedance load for said crystal means;
    said impedance network and said crystal means forming a feedback circuit between said amplifier first and second terminals operable to establish a preselected frequency of oscillation for said crystal means; and
    said impedance load having an overall inductive characteristic to provide that said preselected frequency of oscillation of said crystal means takes place at said first, UHF frequency mode.

2. A crystal controlled oscillator as set forth in claim 1 in which:

said amplifier first, second and third terminals are the emitter, base and collector terminals, respectively, of a transistor.

3. A crystal controlled oscillator as set forth in claim 1 in which:
said piezoelectric crystal means is an SC-cut crystal;
said crystal first UHF frequency mode is a slow shear, C mode;
said crystal second VHF frequency mode is a fast shear, B mode; and
said impedance network provides said impedance load having said overall inductive characteristic to allow said SC-cut crystal to operate at said first, UHF frequency mode and prevent oscillation at said VHF frequency mode.

4. A crystal controlled oscillator as set forth in claim 1 in which:
said impedance network provides said impedance load for said crystal means;
said impedance network includes a pair of serially connected inductors and a capacitor connected in parallel with said pair of inductors; and
each of said inductors and said capacitor has a preselected impedance value selected to provide that said impedance load has an overall inductive characteristic for allowing said crystal means to operate at said first, UHF frequency mode.

5. A crystal controlled oscillator as set forth in claim 1 which includes:
a load adjustment circuit connected between said amplifier third terminal and an external load for matching an overall impedance of said external load to an overall impedance of said amplifier and said feedback circuit.

6. A crystal controlled oscillator operable at a direct UHF frequency comprising:
an amplifier having first, second and third terminals;
a tuning circuit connected to said amplifier third terminal, said tuning circuit receiving a preselected value of voltage for biasing said amplifier;
a piezoelectric crystal means having a first terminal connected with said amplifier third terminal and a second, output terminal;
said piezoelectric crystal means being capable of operating at a first, UHF frequency mode and a second, VHF frequency mode;
an impedance network connected between said amplifier first and third terminals, said network also being connected in parallel relation with said piezoelectric crystal means to provide an impedance load for said crystal means;
said impedance network and said crystal means forming a feedback circuit between said amplifier first and third terminals operable to establish a preselected frequency of oscillation for said crystal means; and
said impedance load having an overall inductive characteristic to provide that said preselected frequency of oscillation of said crystal means takes place at said first, UHF frequency mode.

7. A crystal controlled oscillator as set forth in claim 6 in which:
said amplifier first, second and third terminals are the collector, base and emitter, respectively, of a transistor.

8. A crystal controlled oscillator as set forth in claim 6 in which:
said piezoelectric crystal means is an SC-cut crystal having a first UHF frequency mode which is a slow shear, C mode and a second VHF frequency mode which is a fast shear, B mode.

9. A crystal controlled oscillator as set forth in claim 6 in which:
said impedance network provides said impedance load for said crystal means;
said impedance network includes a pair of serially connected capacitors and an inductor connected in parallel with said pair of capacitors; and
each of said capacitors and said inductor has a preselected impedance value to provide that said impedance load has an overall inductive characteristic for allowing said crystal means to operate at said first, UHF frequency mode.

10. A crystal controlled oscillator as set forth in claim 6 which includes:
a load adjustment circuit connected between said crystal means second terminal and an external load for matching an overall impedance of said external load to an overall impedance of said amplifier and said feedback circuit.

11. A method for making a crystal controlled oscillator operable at a direct UHF frequency comprising the steps of:
connecting a tuning circuit between a first terminal of an amplifier and ground potential, said tuning circuit receiving a preselected value of voltage for biasing said amplifier;
connecting piezoelectric crystal means to said first terminal of said amplifier, said piezoelectric crystal means being capable of operating at a first UHF frequency mode and a second, VHF frequency mode;
interposing an impedance network made from capacitive and inductive components between said piezoelectric crystal means and said second terminal of said amplifier to provide an impedance load for said crystal means;
forming a feedback network from said impedance network and said crystal means operable to establish a preselected frequency of oscillation for said crystal means; and
providing that said impedance load has an overall inductive characteristic so that said preselected frequency of oscillation takes place at said first, UHF frequency mode.

* * * * *